US 7,729,798 B2

(12) United States Patent
Hayashida et al.

(10) Patent No.: US 7,729,798 B2
(45) Date of Patent: Jun. 1, 2010

(54) SUBSTRATE PROCESSING SYSTEM, AND METHOD OF CONTROL THEREFOR, CONTROL PROGRAM, AND STORAGE MEDIUM

(75) Inventors: Yasushi Hayashida, Kumamoto (JP); Yoshitaka Hara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 973 days.

(21) Appl. No.: 10/551,225

(22) PCT Filed: Mar. 26, 2004

(86) PCT No.: PCT/JP2004/004383

§ 371 (c)(1),
(2), (4) Date: Sep. 28, 2005

(87) PCT Pub. No.: WO2004/090972

PCT Pub. Date: Oct. 21, 2004

(65) Prior Publication Data

US 2006/0228195 A1    Oct. 12, 2006

(30) Foreign Application Priority Data

Apr. 2, 2003    (JP) ............................... 2003-099350

(51) Int. Cl.
*G06F 7/00* (2006.01)
(52) U.S. Cl. .................. 700/218; 700/121; 700/214
(58) Field of Classification Search ................ 700/218, 700/213, 214, 228, 229, 121, 112; 438/711
See application file for complete search history.

(56) References Cited

U.S. PATENT DOCUMENTS 5,687,085 A    11/1997    Morimoto et al.

| | | | |
|---|---|---|---|
| 6,507,770 B2 * | 1/2003 | Tateyama et al. | 700/228 |
| 6,535,784 B2 * | 3/2003 | Joma et al. | 700/121 |

(Continued)

FOREIGN PATENT DOCUMENTS

JP    08-153765    6/1996

(Continued)

OTHER PUBLICATIONS

Notification of Transmittal of Translation of the International Preliminary Report on Patentability (Form PCT/IB/338)—PCT/JP2004/004383, dated Jan. 2004.

(Continued)

*Primary Examiner*—Gene Crawford
*Assistant Examiner*—Ramya Prakasam
(74) *Attorney, Agent, or Firm*—Smith, Gambrell & Russell, LLP

(57) ABSTRACT

A transfer schedule SA and a transfer schedule SB for an A lot and a B lot different from each other are generated on a transfer control table, the succeeding transfer schedule SB is moved ahead in the direction of a time axis within a range over which it does not interfere with the transfer schedule SA for the preceding A lot to make the start timing for the succeeding transfer schedule SB become earlier than the end timing for the transfer schedule for the preceding A lot, so that the transfer schedule SA and the transfer schedule SB are executed in parallel, thereby improving the throughput a wafer transfer process.

4 Claims, 13 Drawing Sheets

U.S. PATENT DOCUMENTS

2001/0048865 A1    12/2001    Tateyama et al.

FOREIGN PATENT DOCUMENTS

| | | |
|---|---|---|
| JP | 09-181143 | 7/1997 |
| JP | 11-045926 | 2/1999 |
| JP | 2001-345241 | 12/2001 |
| JP | 2002-506285 | 2/2002 |
| WO | WO 99/45575 | 9/1999 |

OTHER PUBLICATIONS

PCT International Preliminary Report on Patentability (Form PCT/IB/409)—PCT/JP2004/004383, dated Jan. 2004.

* cited by examiner

M1~M6 : MODULES
A1~A5 : WAFER NUMBER OF LOT OF TRANSFER FLOW A
B1~B5 : WAFER NUMBER OF LOT OF TRANSFER FLOW B

| TRANSFER FLOW A | M1→M2→M3→M4→M5→M6 |
| TRANSFER FLOW B | M1→M2→M3→M5→M4→M6 |

M1~M8 : MODULES
A1~A5 : WAFER NUMBER OF LOT OF TRANSFER FLOW A
B1~B5 : WAFER NUMBER OF LOT OF TRANSFER FLOW B

| TRANSFER FLOW A | M1→M2→M3→M4→M5→M6→M8 |
| TRANSFER FLOW B | M1→M2→M3→M4→M7→M8 |

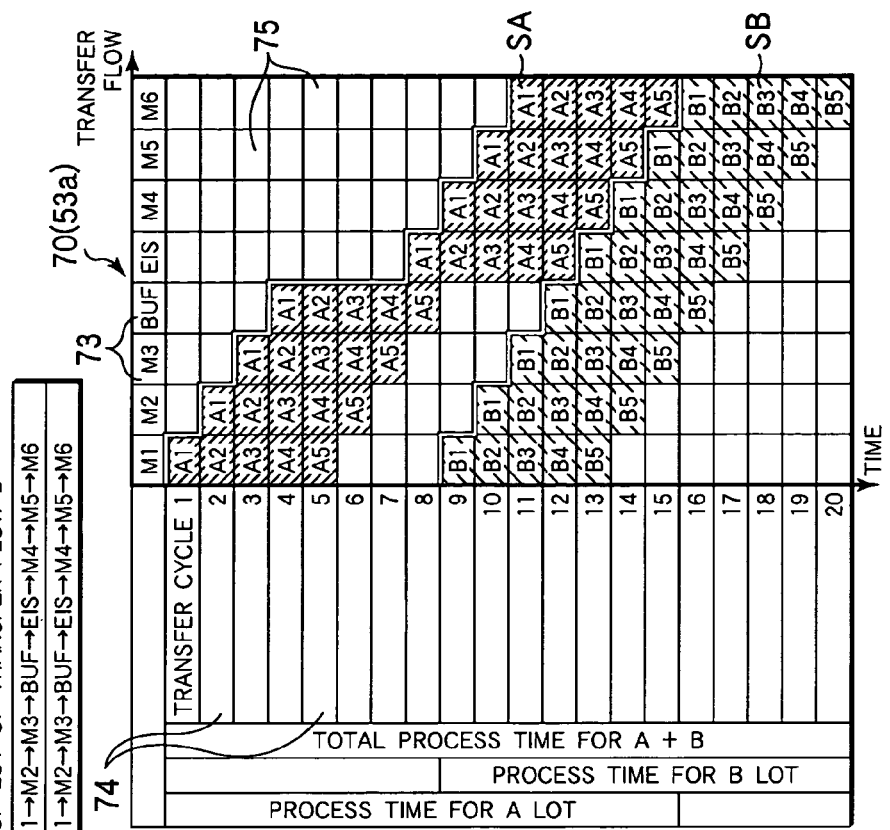
FIG.12A
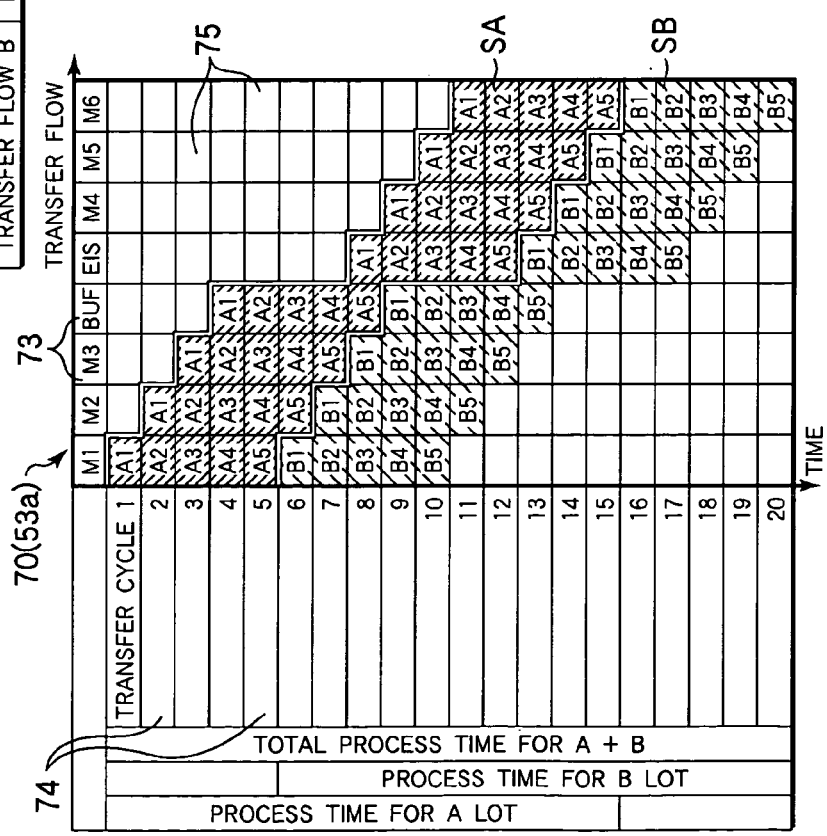
FIG.12B
FIG.12C

M1~M8 : MODULES
A1~A5 : WAFER NUMBER OF LOT OF TRANSFER FLOW A
B1~B5 : WAFER NUMBER OF LOT OF TRANSFER FLOW B

| TRANSFER FLOW A | M1→M2→M3→M4→M6→M7→M8<br>M5 |
| TRANSFER FLOW B | M1→M2→M3→M4→M5→M6→M7→M8 |

SUBSTRATE PROCESSING SYSTEM, AND METHOD OF CONTROL THEREFOR, CONTROL PROGRAM, AND STORAGE MEDIUM

TECHNICAL FIELD

The present invention relates to a substrate processing system which executes processes preceding and following an exposure process on a substrate, such as a semiconductor wafer, a control method and control program therefor, and a storage medium storing the program.

BACKGROUND ART

For example, in semiconductor device fabrication process, a resist pattern is formed as a mask for forming a predetermined pattern by a so-called photolithography technology in which after a resist liquid is supplied to the top surface of a semiconductor wafer (hereinafter called "wafer") to form a resist film, and an exposure process of a predetermined pattern is performed on a resist-coated wafer, an exposure pattern formed on the resist film on the wafer is developed.

In such a photolithography process, it is known to couple an exposure apparatus to a substrate processing system constructed in such a way as to integrate a plurality of modules which perform resist coating and development before and after exposure, baking, etc. and achieve space reduction, an improvement on the throughput, and the like (for example, Unexamined Japanese Patent Application KOKAI Publication No. 2001-345241).

While the substrate processing system in which a plurality of modules are integrated as mentioned above is provided with a transfer mechanism which transfers a substrate among individual modules, there are multifarious combinations of pre-processes and post-processes of exposure (i.e., modules) and process orders, and efficient control of the transfer mechanism which moves a control method among those modules becomes an important factor to determine the performance of the substrate processing system.

According to the conventional control method of the transfer mechanism in such a substrate processing system, the present positional information (in which module the substrate lies) is stored as management information of the transfer mechanism in a memory, and the next transfer position is decided each time based on a transfer recipe (information comprised of a combination of the modules and a sequential transfer order among modules). In the process of a complicated transfer recipe using a plurality of modules, therefore, there is a problem such that the substrate transfer timing cannot be predicted and the transfer time is significantly disturbed. This problem is particularly noticeable when the transfer recipe differs between a plurality of lots which are executed in order.

Because the substrate transfer timing cannot be predicted as mentioned above, there arises another problem such that it is difficult to process a plurality of lots in parallel without causing an inconvenience, such as passing a substrate between the lots, and in a case where a plurality of lots with different recipes are carried out consecutively, it is necessary to start a succeeding lot when the process of a preceding lot is completely finished, and the overall processing time becomes simple summation of the required times of the individual lots so that an improvement on the throughput cannot be expected.

As the module by which a substrate passes is not predetermined, feedforward control which predicts the future transfer timing of the substrate during a lot process and performs control is also difficult.

Further, as the transfer position of a substrate is determined every time, it is difficult for a system manager to visually grasp the transfer conditions of all the substrates in the unit of a lot, and there is room for improvement even from the viewpoint of operability.

DISCLOSURE OF INVENTION

The present invention has been made in view of the situations. It is an object of the present invention to provide a substrate processing system capable of achieving a stable substrate transfer process by suppressing the disturbance of the transfer time at the time of executing multifarious transfer recipes consecutively, and a control method therefor.

It is another object of the present invention to provide a substrate processing system capable of improving the throughput by shortening the process time in consecutive processes of a plurality of lots with multifarious transfer recipes, and a control method therefor.

It is still another object of the present invention to provide a substrate processing system capable of achieving various transfer controls by feedforward control in a substrate transfer process, and a control method therefor.

It is a further object of the present invention to provide a substrate processing system capable of improving the operability in substrate transfer control, and a control method therefor.

It is still further object of the present invention to provide a control program which can realize the aforementioned controls, and a storage medium storing such a program.

To overcome the problems, according to the first aspect of the present invention, there is provided a substrate processing system including a plurality of modules into and out of which a substrate is transferred, and a substrate moving mechanism which moves the substrate among the modules, the system comprising:

a transfer control table in which a transfer schedule representing a relationship between a transfer timing of the substrate and the modules into and out of which the substrate is transferred is stored; and control means including a function of generating the transfer schedule of a plurality of substrates in a unit of a lot on the transfer control table, and a function of controlling the substrate moving mechanism based on the transfer schedule read from the transfer control table.

According to the second aspect of the invention, there is provided a substrate processing system including a plurality of modules into and out of which a substrate is transferred, and a substrate moving mechanism which moves the substrate among the modules, the system comprising:

a transfer control table in which a transfer schedule representing a relationship between a transfer timing of the substrate and the modules into and out of which the substrate is transferred is stored; and control means including a function of generating the transfer schedule of a plurality of substrates in a unit of a lot on the transfer control table, a function of setting a start timing for the transfer schedule of a succeeding lot ahead to an end timing for a preceding lot within a range over which the transfer schedule of each of a plurality of the lots does not interfere, and a function of controlling the substrate moving mechanism based on the transfer schedule read from the transfer control table.

According to the third aspect of the invention, there is provided a substrate processing system including a plurality of modules into and out of which a substrate is transferred, and a substrate moving mechanism which moves the substrate among the modules, and comprising:

a transfer control table comprised of a time axis along which transfer timings at which a transfer operation of the substrate is performed in a predetermined cycle is set, and a transfer flow axis along which the modules into and out of which the substrate is transferred are laid out; and control means including a function of generating the transfer schedule of a plurality of substrates in a unit of a lot on the transfer control table by setting identification information of each of the substrates which is transferred into and out from the modules with respect to a cell to be specified by designating a specific one of the transfer timings and a specific one of the modules in the two-dimensional table, a function of moving all of the cells included in the transfer schedule of a succeeding lot ahead in a direction of the time axis within a range over which a contour of a figure constituted by the cells included in the transfer schedule of each of a plurality of the lots set on the transfer control table does not interfere, and a function of controlling the substrate moving mechanism based on the transfer schedule read from the transfer control table at every the transfer timing.

According to the fourth aspect of the invention, there is provided a substrate processing system including a resist coating module which performs resist coating on a semiconductor substrate, a development module which develops a resist coated on the semiconductor substrate, and a process module which performs any one of a hydrophobic process, a heating process, a cooling process, and a holding process on the semiconductor substrate, and a substrate moving mechanism which moves the semiconductor substrate among the modules, and comprising:

a transfer control table comprised of a time axis along which transfer timings at which a transfer operation of the semiconductor substrate is performed in a predetermined cycle is set, and a transfer flow axis along which the modules into and out of which the semiconductor substrate is transferred are laid out; and control means including a function of generating the transfer schedule of a plurality of semiconductor substrates in a unit of a lot on the transfer control table by setting identification information of each of the semiconductor substrates which is transferred into and out from the modules with respect to a cell to be specified by designating a specific one of the transfer timings and a specific one of the modules in the two-dimensional table, a function of moving all of the cells included in the transfer schedule of a succeeding lot ahead in a direction of the time axis within a range over which a contour of a figure constituted by the cells included in the transfer schedule of each of a plurality of the lots set on the transfer control table does not interfere, and a function of controlling the substrate moving mechanism based on the transfer schedule read from the transfer control table at every the transfer timing.

According to the fifth aspect of the invention, there is provided a control method for a substrate processing system including a plurality of modules into and out of which a substrate is transferred, and a substrate moving mechanism which moves the substrate among the modules, the control method comprising steps of:

generating, on a transfer control table in which a transfer schedule representing a relationship between a transfer timing of the substrate and the modules into and out of which the substrate is transferred is stored, the transfer schedule of a plurality of substrates in a unit of a lot on the transfer control table; and controlling the substrate moving mechanism based on the transfer schedule read from the transfer control table.

According to the sixth aspect of the invention, there is provided a control method for a substrate processing system including a plurality of modules into and out of which a substrate is transferred, and a substrate moving mechanism which moves the substrate among the modules, the control method comprising steps of:

generating, on a transfer control table in which a transfer schedule representing a relationship between a transfer timing of the substrate and the modules into and out of which the substrate is transferred is stored, the transfer schedule of a plurality of substrates in a unit of a lot on the transfer control table;

moving a start timing for the transfer schedule of a succeeding lot ahead to an end timing for a preceding lot within a range over which the transfer schedule of each of a plurality of the lots set on the transfer control table does not interfere; and controlling the substrate moving mechanism based on the transfer schedule read from the transfer control table.

According to the seventh aspect of the invention, there is provided a control method for a substrate processing system including a plurality of modules into and out of which a substrate is transferred, and a substrate moving mechanism which moves the substrate among the modules, the control method comprising steps of:

generating, on a transfer control table comprised of a time axis along which transfer timings at which a transfer operation of the substrate is performed in a predetermined cycle is set, and a transfer flow axis along which the modules into and out of which the substrate is transferred are laid out, the transfer schedule of a plurality of substrates in a unit of a lot on the transfer control table by setting identification information of each of the substrates which is transferred into and out from the modules with respect to a cell to be specified by designating a specific one of the transfer timings and a specific one of the modules in the two-dimensional table;

moving all of the cells included in the transfer schedule of a succeeding lot ahead in a direction of the time axis within a range over which a contour of a figure constituted by the cells included in the transfer schedule of each of a plurality of the lots set on the transfer control table does not interfere; and controlling the substrate moving mechanism based on the transfer schedule read from the transfer control table at every the transfer timing.

According to the eighth aspect of the invention, there is provided a control method for a substrate processing system including a resist coating module which performs resist coating on a semiconductor substrate, a development module which develops a resist coated on the semiconductor substrate, and a process module which performs any one of a hydrophobic process, a heating process, a cooling process, and a holding process on the semiconductor substrate, and a substrate moving mechanism which moves the semiconductor substrate among the modules, the control method comprising steps of:

generating, on a transfer control table comprised of a time axis along which transfer timings at which a transfer operation of the semiconductor substrate is performed in a predetermined cycle is set, and a transfer flow axis along which the modules into and out of which the semiconductor substrate is transferred are laid out, the transfer schedule of a plurality of semiconductor substrates in a unit of a lot on the transfer control table by setting identification information of each of the semiconductor substrates which is transferred into and out from the modules with respect to a cell to be specified by designating a specific one of the transfer timings and a specific one of the modules in the two-dimensional table;

moving all of the cells included in the transfer schedule of a succeeding lot ahead in a direction of the time axis within a range over which a contour of a figure constituted by the cells included in the transfer schedule of each of a plurality of the lots set on the transfer control table does not interfere; and controlling the substrate moving mechanism based on the transfer schedule read from the transfer control table at every the transfer timing.

According to the ninth aspect of the invention, there is provided a control program for a substrate processing system including a plurality of modules into and out of which a substrate is transferred, a substrate moving mechanism which moves the substrate among the modules, and a computer which controls the modules and the substrate moving mechanism, the control program allowing the computer to execute:

a step of generating, on a transfer control table in which a transfer schedule representing a relationship between a transfer timing of the substrate and the modules into and out of which the substrate is transferred is stored, the transfer schedule of a plurality of substrates in a unit of a lot on the transfer control table; and a step of controlling the substrate moving mechanism based on the transfer schedule read from the transfer control table.

According to the tenth aspect of the invention, there is provided a control program for a substrate processing system including a plurality of modules into and out of which a substrate is transferred, a substrate moving mechanism which moves the substrate among the modules, and a computer which controls the modules and the substrate moving mechanism, the control program allowing the computer to execute:

a step of generating, on a transfer control table in which a transfer schedule representing a relationship between a transfer timing of the substrate and the modules into and out of which the substrate is transferred is stored, the transfer schedule of a plurality of substrates in a unit of a lot on the transfer control table;

a step of moving a start timing for the transfer schedule of a succeeding lot ahead to an end timing for a preceding lot within a range over which the transfer schedule of each of a plurality of the lots set on the transfer control table does not interfere; and a step of controlling the substrate moving mechanism based on the transfer schedule read from the transfer control table.

According to the eleventh aspect of the invention, there is provided a computer readable storage medium storing a control program for a substrate processing system including a plurality of modules into and out of which a substrate is transferred, a substrate moving mechanism which moves the substrate among the modules, and a computer which controls the modules and the substrate moving mechanism, the control program allowing the computer to execute:

a step of generating, on a transfer control table in which a transfer schedule representing a relationship between a transfer timing of the substrate and the modules into and out of which the substrate is transferred is stored, the transfer schedule of a plurality of substrates in a unit of a lot on the transfer control table; and a step of controlling the substrate moving mechanism based on the transfer schedule read from the transfer control table.

According to the twelfth aspect of the invention, there is provided a computer readable storage medium storing a control program for a substrate processing system including a plurality of modules into and out of which a substrate is transferred, a substrate moving mechanism which moves the substrate among the modules, and a computer which controls the modules and the substrate moving mechanism, the control program allowing the computer to execute:

a step of generating, on a transfer control table in which a transfer schedule representing a relationship between a transfer timing of the substrate and the modules into and out of which the substrate is transferred is stored, the transfer schedule of a plurality of substrates in a unit of a lot on the transfer control table;

a step of moving a start timing for the transfer schedule of a succeeding lot ahead to an end timing for a preceding lot within a range over which the transfer schedule of each of a plurality of the lots set on the transfer control table does not interfere; and a step of controlling the substrate moving mechanism based on the transfer schedule read from the transfer control table.

According to the invention mentioned above, the relationship between a substrate transfer timing and a passing module is set on the transfer control table for all the wafers in a lot, a substrate is transferred by sequentially reading the setting in a predetermined cycle in the direction of the time axis and controlling the substrate moving mechanism, so that occurrence of disturbance of the transfer time can be suppressed as compared with a case where a substrate transfer position is decided every transfer. At the time of successively processing lots with complicated transfer recipes, the transfer start timings for the respective lots can be optimized without causing a problem, such as occurrence of passing of a wafer between lots, so that transfer of a succeeding lot can be started before processing of a preceding lot is completely finished, and the throughput is improved by shortening of the processing time achieved by the parallel transfer of a plurality of lots.

As a module which is passed at each transfer timing is determined beforehand, feedforward control can ensure control to which the process characteristics of the individual modules are added.

The display of the transfer control table in a visible form can allow a system manager to grasp the active states of the individual modules and the transfer mechanism, thereby improving the operability.

BRIEF DESCRIPTION OF DRAWINGS

FIG. 11A is a diagram illustrating a transfer flow embodying the transfer flow in FIG. 9A.

FIGS. 11B and 11C are diagrams showing one example of transfer tables originating from the conceptual diagrams in FIGS. 9B and 9C based on the transfer flow in FIG. 11A.

FIG. 12A is a diagram illustrating a transfer flow embodying the transfer flow in FIG. 9A.

FIGS. 12B and 12C are diagrams showing another example of transfer tables originating from the conceptual diagrams in FIGS. 9B and 9C based on the transfer flow in FIG. 12A.

BEST MODE FOR CARRYING OUT THE INVENTION

An embodiment of the present invention will be described in detail below with reference to the accompanying drawings.

Figure 1:
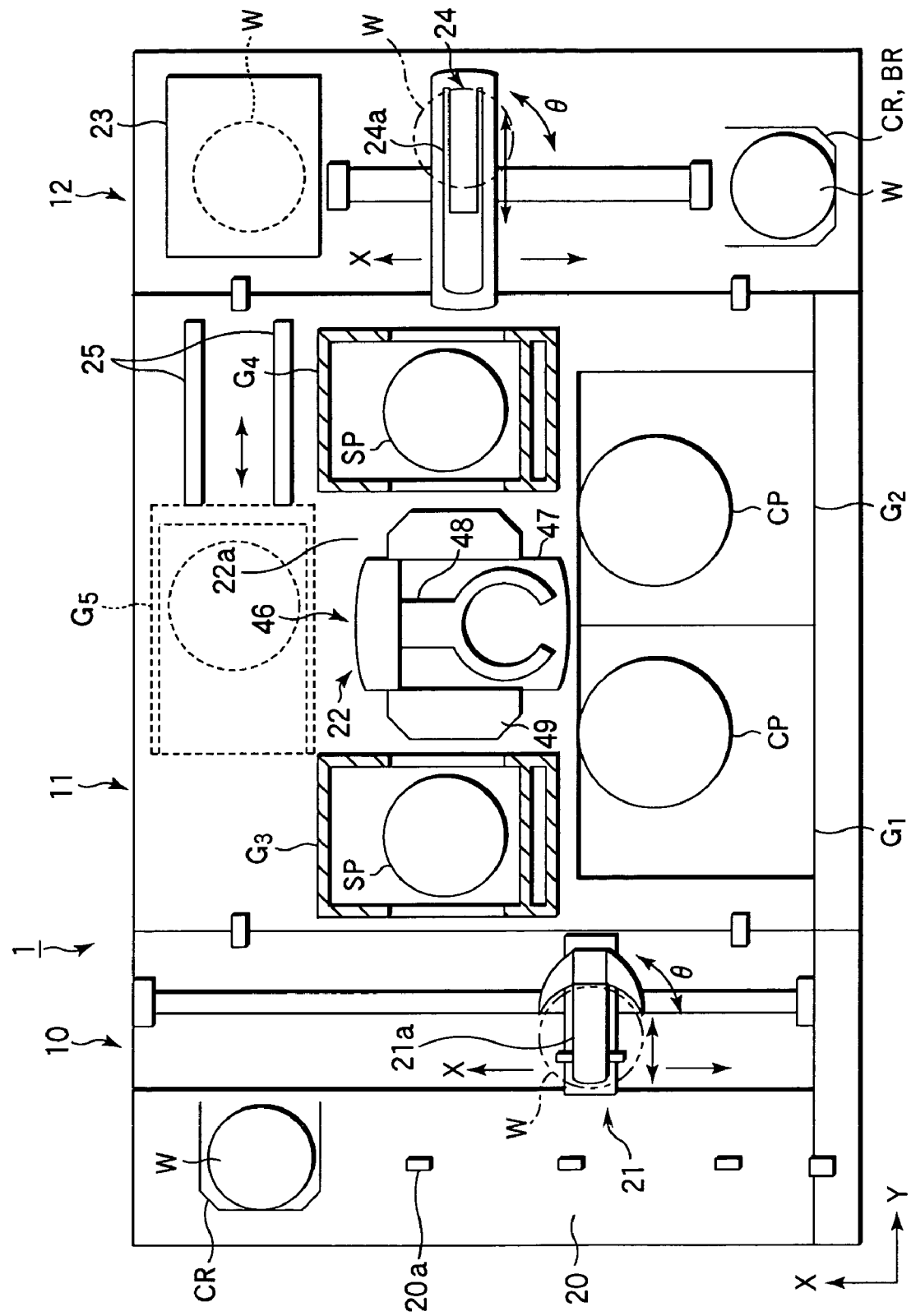
FIG. 1 is a plan view showing the general configuration of a resist coating and developing system for a semiconductor wafer to which a substrate processing system according to one embodiment of the present invention is adapted.
Figure 2:
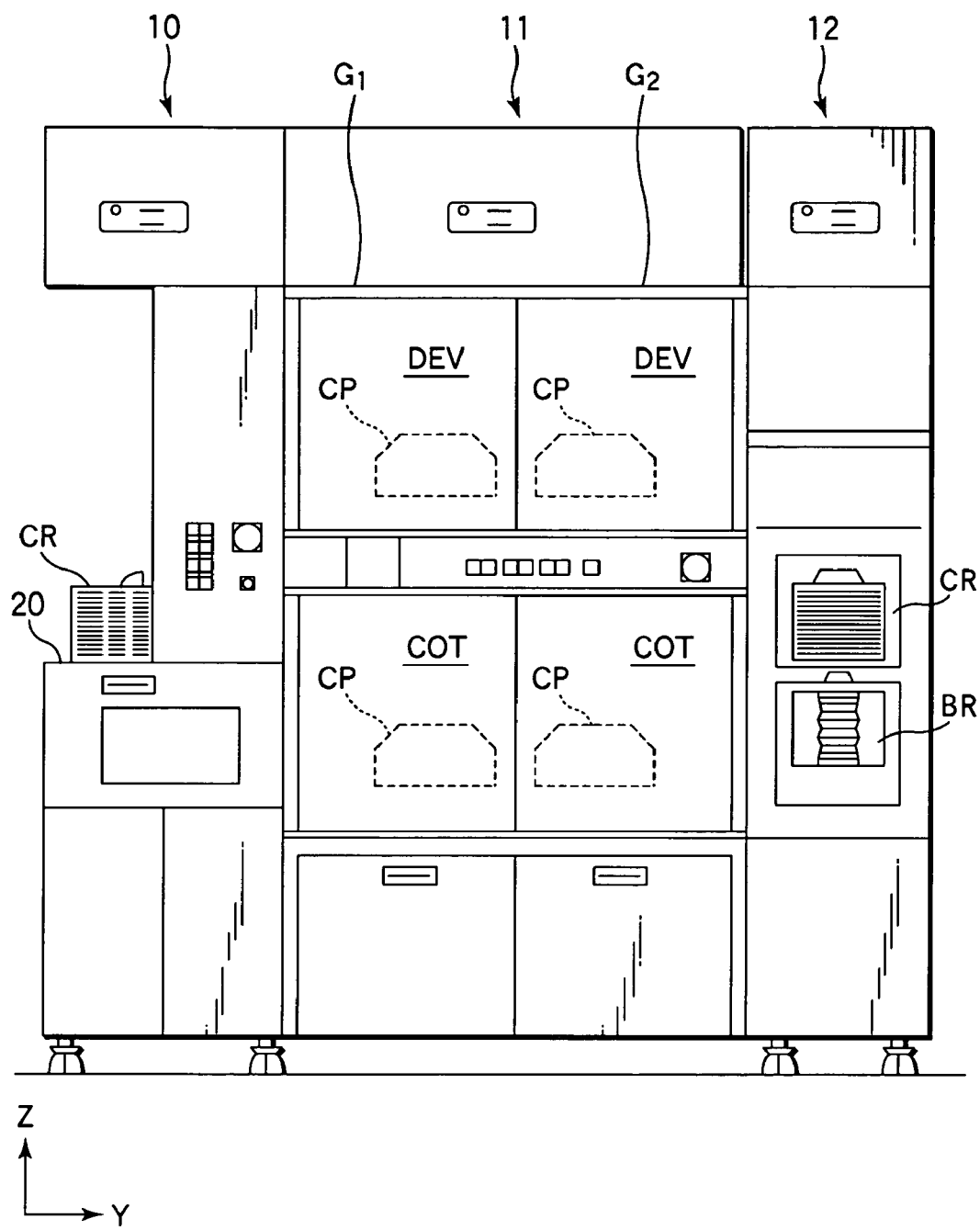
FIG. 2 is a front view showing the resist coating and developing system shown in FIG. 1.
Figure 3:
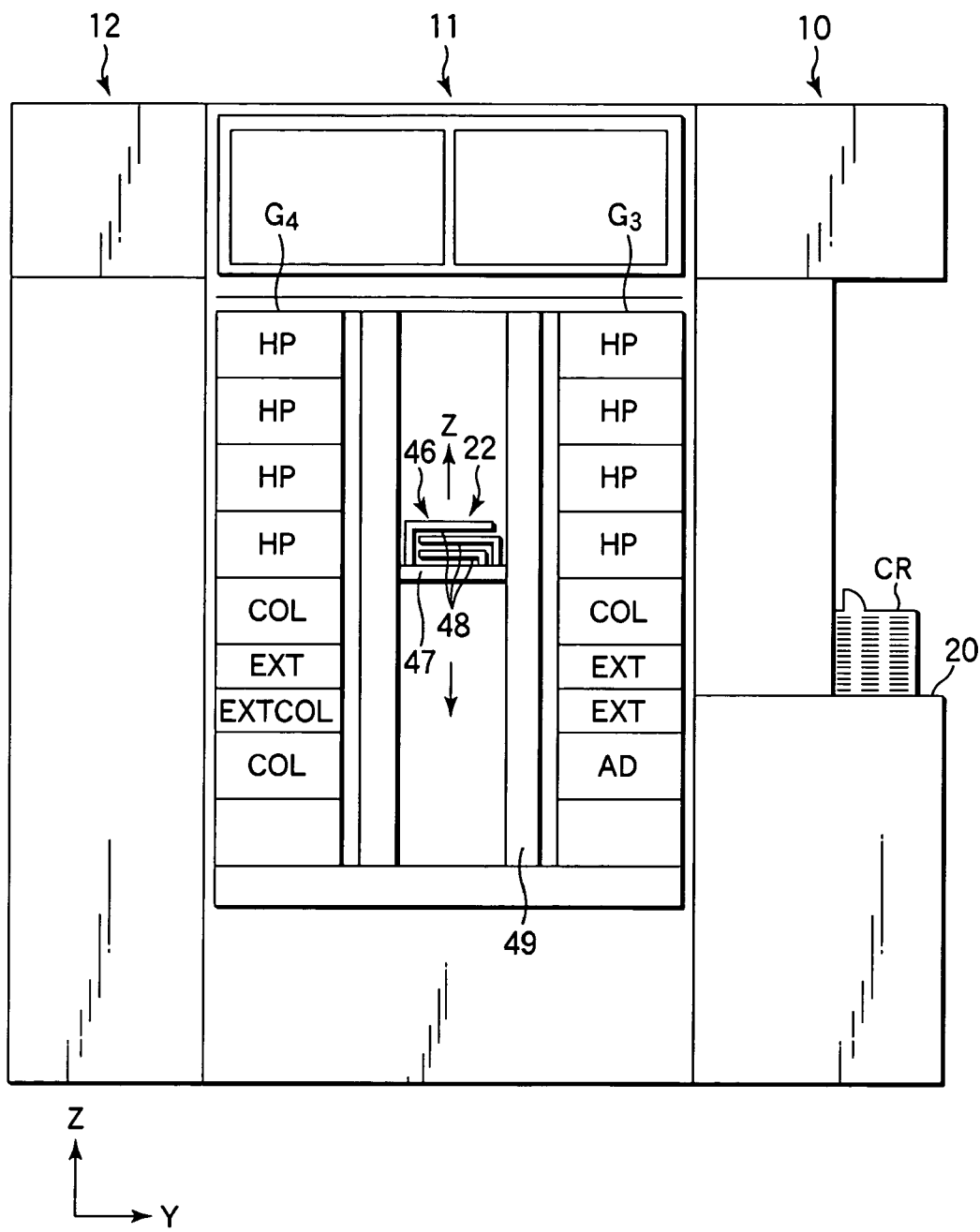
FIG. 3 is a rear view showing the resist coating and developing system shown in FIG. 1.

FIG. 1 is a schematic plan view showing a resist coating and developing system as one embodiment of a substrate processing system of the invention, FIG. 2 is a front view thereof, and FIG. 3 is a rear view thereof. In those diagrams, directions orthogonal to each other in a plane are indicated by X-Y, and a vertical direction is indicated by Z.

Figure 4:
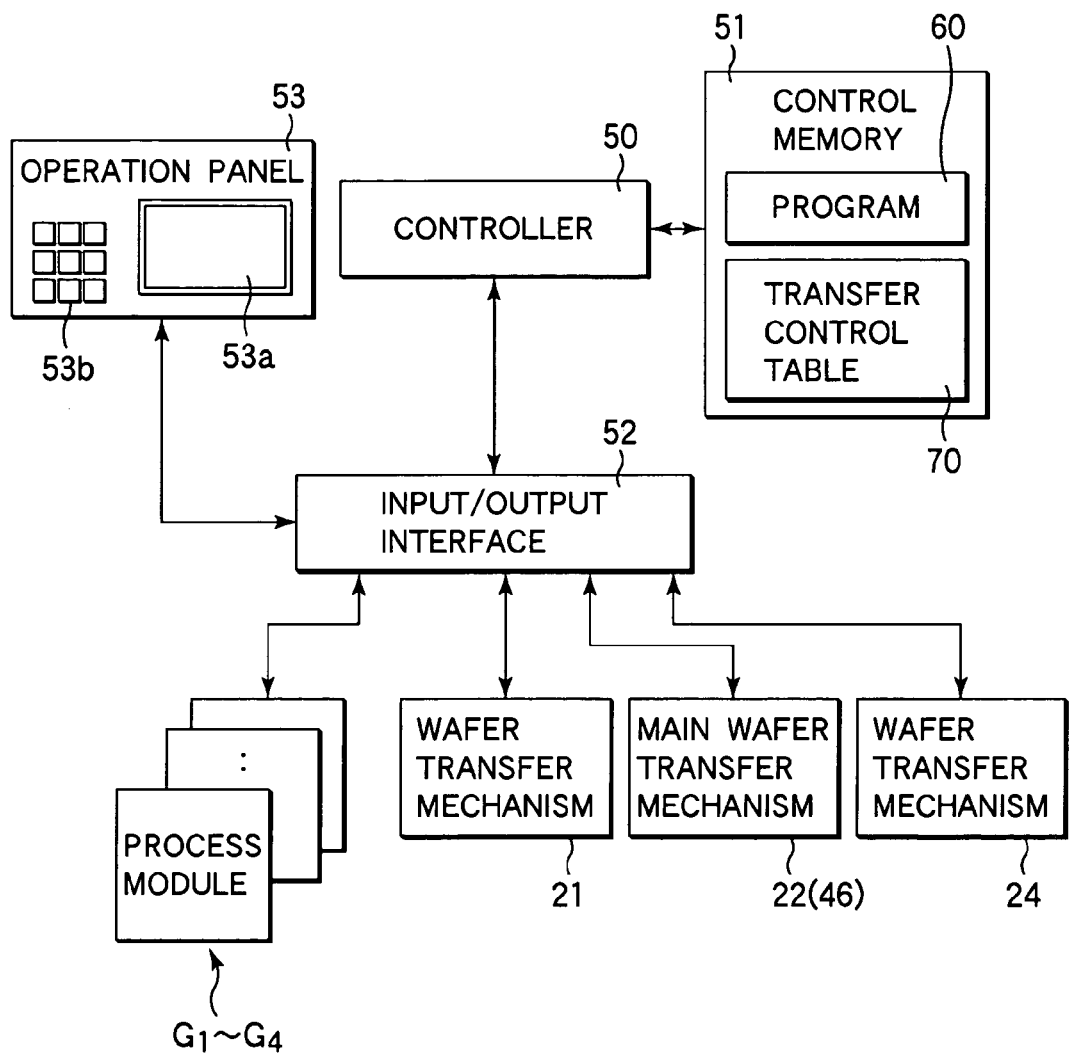
FIG. 4 is a conceptual diagram illustrating one example of the configuration of a control system of the resist coating and developing system in FIG. 1.
Figure 5:
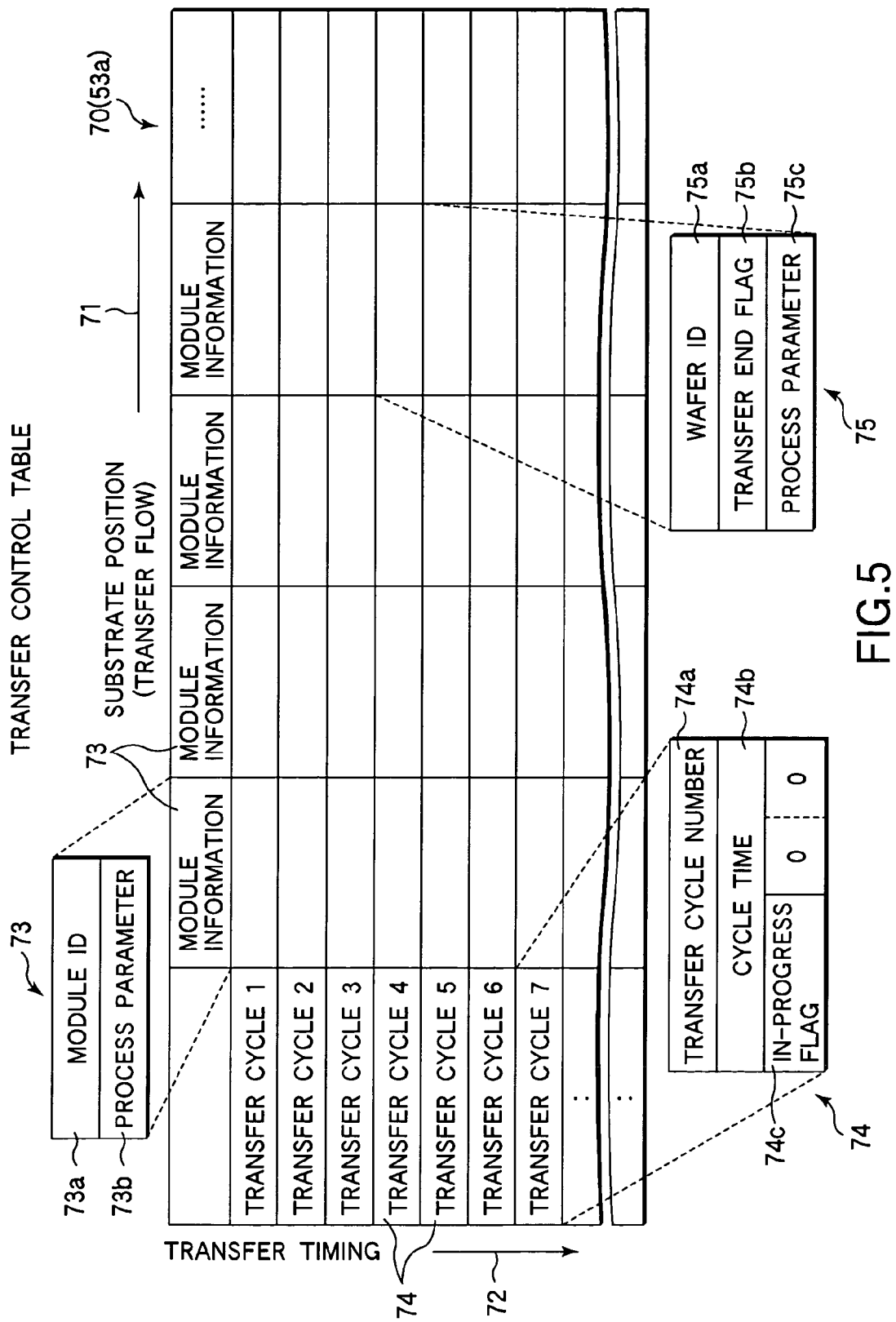
FIG. 5 is a conceptual diagram for explaining a transfer control table to be used in the substrate processing system according to one embodiment of the present invention.

FIG. 4 is a conceptual diagram illustrating one example of the configuration of the control system of the resist coating and developing system according to the embodiment, and FIG. 5 is a conceptual diagram illustrating one example of a transfer control table to be used in the embodiment.

This resist coating and developing system 1 comprises a cassette station 10 as a transfer station, a process station 11 having a plurality of modules, and an interface section 12 for transferring a wafer W to an unillustrated exposure apparatus provided adjacent to the process station 11.

The cassette station 10 transfers a plurality of wafers W as subjects to be processed, e.g., 25 wafers in a unit, into this system from another system or transfers the wafers to another system from the system with the wafers placed on a wafer cassette CR, and transfers the wafers W between the wafer cassette CR and the process station 11.

In the cassette station 10, as shown in FIG. 1, a plurality of positioning projections 20a (four in the diagram) are formed along an X direction in the diagram on a placing table 20 on which wafer cassettes CR are to be placed, and the wafer cassettes CR are placed in a line at the locations of the positioning projections 20a, with their wafer outlet/inlet ports facing toward the process station 11. In the ware cassette CR, the wafers W are laid out in a vertical direction (Z direction). The cassette station 10 also has a wafer transfer mechanism 21 positioned between the placing table 20 and the process station 11. The wafer transfer mechanism 21 is movable in the cassette layout direction (X direction) and the layout direction of the wafers W in the wafer cassette CR (Z direction), and has a wafer-transfer arm 21a which is movable back and forth in a Y direction, and can selectively access any wafer cassette CR with the wafer-transfer arm 21a. The wafer-transfer arm 21a is constructed in such a way as to be rotatable in a θ direction, and can also access an extension unit (EXT) belonging to a third process section $G_3$ of the process station 11 to be described later.

The process station 11 has the plurality of modules for carrying out a series of processes when coating and development are performed on the wafer W, and the modules are arranged in multiple stages at predetermined positions to process the wafers W one by one. As illustrated in FIG. 1, the process station 11 has a wafer-transfer passage 22a at the center portion thereof, in which a main wafer transfer mechanism 22 is provided, with all the modules laid out around the wafer-transfer passage 22a. Those modules are separated into a plurality of module groups in each of which a plurality of modules are laid out in multiple stages along the normal direction.

As illustrated in FIG. 3, the main wafer transfer mechanism 22 is structured that it has a wafer transfer device 46 elevatable in the up and down direction (Z direction) inside a cylindrical support 49. The cylindrical support 49 is rotatable by the rotational driving force of a motor (not shown), while the wafer transfer device 46 can rotate integrally with the cylindrical support 49.

The wafer transfer device 46 has a plurality of holding members 48 movable in the back and forth directions of a convey base 47, whereby the transfer of the wafer W among the respective modules is enabled by the holding members 48.

As illustrated in FIG. 1, according to the embodiment, four module groups $G_1$, $G_2$, $G_3$ and $G_4$ are laid out around the wafer-transfer passage 22a, and a module group $G_5$ can be laid out as needed.

The first and second module groups $G_1$ and $G_2$ among them are laid out in parallel with each other on the front side of the system, the third module group $G_3$ is provided adjacent to the cassette station 10, while the fourth module group $G_4$ is provided adjacent to the interface station 12. A fifth module group $G_5$ can be laid out on the rear side.

In the first module group $G_1$, two of resist coating units (COT) of a spinner type, which applies a resist to the wafer W placed on a spin chuck (not illustrated) in a coater cup (CP), and two developing modules (DEV), which develop a pattern of a resist, are placed one on the other in two stages in order from the bottom. Likewise, in the second module group $G_2$, two resist coating units (COT) and two developing units (DEV) as spinner type modules are placed one on the other in two stages in order from the bottom.

As illustrated in FIG. 3, in the third module group $G_3$, multiple oven type modules which carry out a predetermined process on the wafer W placed on a susceptor SP are placed one on another in multiple stages. Specifically, an adhesion unit (AD) which carries out a so-called hydrophobic process for enhancing the fixability of a resist, two extension units (EXT) which carry the wafer W in and out, a cooling unit (COL) for performing a cooling process, and four hot plate units (HP) which perform heat processing on the wafer W before an exposure process, after the exposure process, and after a developing process are placed one on another in eight stages in order from the bottom. A cooling unit (COL) with an alignment function may be provided.

In the fourth module group $G_4$, oven type modules are placed one on another in multiple stages. That is, a cooling unit (COL), an extension cooling unit (EXTCOL) as a wafer carry-in/carry-out section having a cooling plate, an extension unit (EXT), a cooling unit (COL), and four hot plate units (HP) are placed one on another in eight stages in order from the bottom.

When the fifth module group $G_5$ is provided on the rear side of the main wafer transfer mechanism 22, it is movable sideways as seen from the main wafer transfer mechanism 22 along a guide rail 25. Therefore, even if the fifth module group $G_5$ is provided, a room can be secured by sliding it along the guide rail 25, so that a maintenance work for the main wafer transfer mechanism 22 can be easily carried out from the rear side thereof.

The interface section 12 has the same length in the depth direction (X direction) as the process station 11, and, as illustrated in FIGS. 1 and 2, a portable pickup cassette CR and a fixed buffer cassette BR are laid out in two stages on its front side, a wafer edge exposure device 23 on a rear side thereof, and a wafer transfer mechanism 24 at the center portion thereof. The wafer transfer mechanism 24 has a wafer-transfer arm 24a which can move in the X direction, Y direction and Z direction so as to be accessible to both cassettes CR and BR, and the wafer edge exposure device 23. The wafer-transfer arm 24a is rotatable in the θ direction, and is accessible to the extension unit (EXT) belonging to the fourth module group $G_4$ of the process station 11, and a wafer transfer table (not shown) on the adjoining exposure apparatus side.

One example of the control system in the resist coating and developing system according to the present embodiment as described above will be discussed next.

As exemplified in FIG. 4, the resist coating and developing system according to the embodiment comprises a controller 50 which controls the entire system, a program 60 which operates the controller 50, and a control memory 51 where control information, such as a transfer control table 70 to be discussed later, is stored. The controller 50 is comprised of a computer system, is connected to a plurality of units (modules) $G_1$ to $G_4$ mentioned above via an input/output interface 52, and controls aforementioned various processes in an individual unit by the program 60.

The wafer transfer mechanism 21, the main wafer transfer mechanism 22 and the wafer transfer mechanism 24 are also connected to the controller 50 via the input/output interface 52, and execute a wafer transfer operation to be discussed later under the control of the controller 50 by the program 60.

Connected to the controller 50 are an operation panel 53 equipped with user interfaces, such as a display 53a and a keyboard 53b, so that a system manager can control the operation of the controller 50 by a command given externally and input information for setting and updating control information.

Referring to FIG. 5, one example of the transfer control table 70 will be discussed. The transfer control table 70 according to the embodiment comprises a two-dimensional table having a transfer flow axis 71 along which module information 73 specifying a plurality of units to be used in achieving a series of process (hereinafter called process recipe) on the wafer W is arranged, and a transfer timing axis 72 indicating a transfer cycle 74 that moves the wafer W in a predetermined order between individual units.

Stored in the individual module information 73 of the transfer flow axis 71 are a module ID 73a, such as a module name which specifies an individual module, and a process parameter 73b in which information of the default operational condition or the like of the module in the process recipe is set.

Stored in the entries of the individual transfer cycle 74 of the transfer timing axis 72 is information, such as a transfer cycle number 74a indicating the execution order, a cycle time 74b indicating the execution period of each transfer cycle, and an in-progress flag 74c indicating the completion of the operation in the transfer cycle.

In a cell at which each of plural transfer cycles arranged along the transfer timing axis 72 and the module information 73 of the transfer flow axis 71 (a portion defined by vertical and horizontal lines), wafer identification information 75 (transfer JOB) about a wafer W to be transferred into that unit in the transfer cycle is set. Stored in each wafer identification information 75 is information, such as a wafer ID 75a, such as a wafer number in each lot, a transfer end flag 75b indicating the completion of transfer of the wafer to the module (indicating whether there is a wafer in the module at present or not; ON: present, OFF: absent), and a process parameter 75c which is used at the time of setting a unique parameter to the wafer in the module.

The information, such as the module information 73, the transfer cycle 74, the wafer identification information 75, in the transfer control table 70 can be displayed on the display 53a occasionally and can be edited by an operator using the keyboard 53b or the like.

Next, one example of the process operation according to the embodiment will be described. In the resist coating and developing system 1 of the embodiment, unprocessed wafers W are carried out from the wafer cassette CR one by one and are carried into the extension unit (EXT) by the wafer transfer mechanism 21. Then, the wafer W placed there is carried out and transferred to the adhesion unit (AD) by the main wafer transfer mechanism 22 to be subjected to an adhesion process. After the adhesion process ends, the wafer W is carried out and transferred to the cooling unit (COL) by the main wafer transfer mechanism 22 and is cooled there. Next, the wafer W is transferred to the resist coating unit (COT) to undergo resist coating, further undergoes prebaking in the hot plate unit (HP), is transferred to the interface section (EIS) 12 via the extension cooling unit (EXTCOL), and is transferred from there to the unillustrated adjoining exposure apparatus through a peripheral exposure apparatus (WEE) 23 by the wafer transfer mechanism 24.

Further, the wafer W undergone the exposure process in the exposure apparatus is transferred the process station 11 via the interface section (EIS) 12 and the extension unit (EXT) by the wafer transfer mechanism 24. In the process station 11, the wafer W is transferred the hot plate unit (HP) by the main wafer transfer mechanism 22 to undergo a post-exposure process, is then transferred the developing unit (DEV) to undergo a developing process, is then subjected to post-baking in the hot plate unit (HP), is cooled by the cooling unit (COL), and is then transferred the cassette station 10 via the extension unit (EXT). The wafer W which has been subjected to predetermined processes in the above-described manner is retained on the wafer cassette CR by the wafer transfer mechanism 21.

Figure 6:
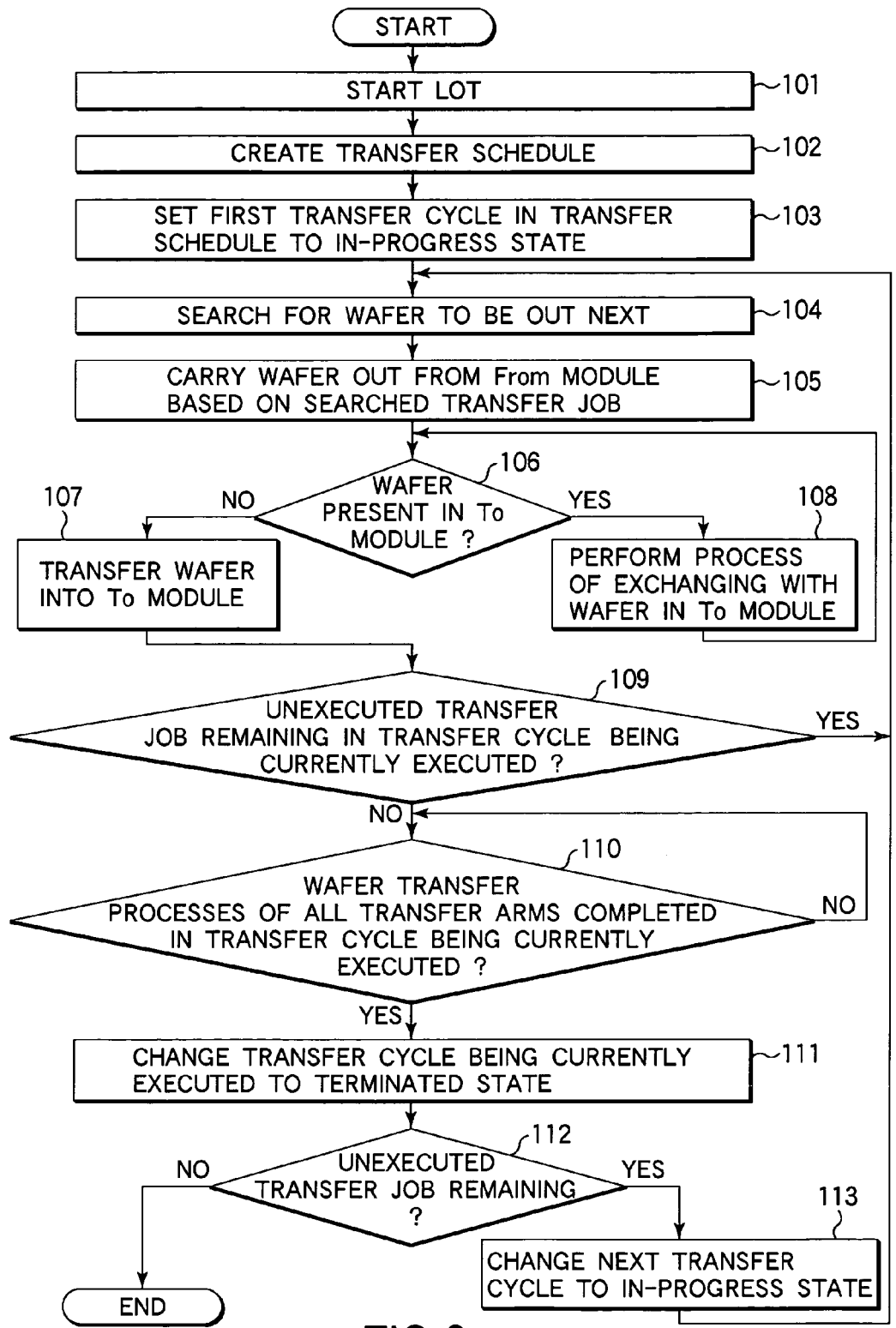
FIG. 6 is a flowchart illustrating a control flow of a transfer operation of a main wafer transfer mechanism 22 in the resist coating and developing system in FIG. 1.
Figure 7:
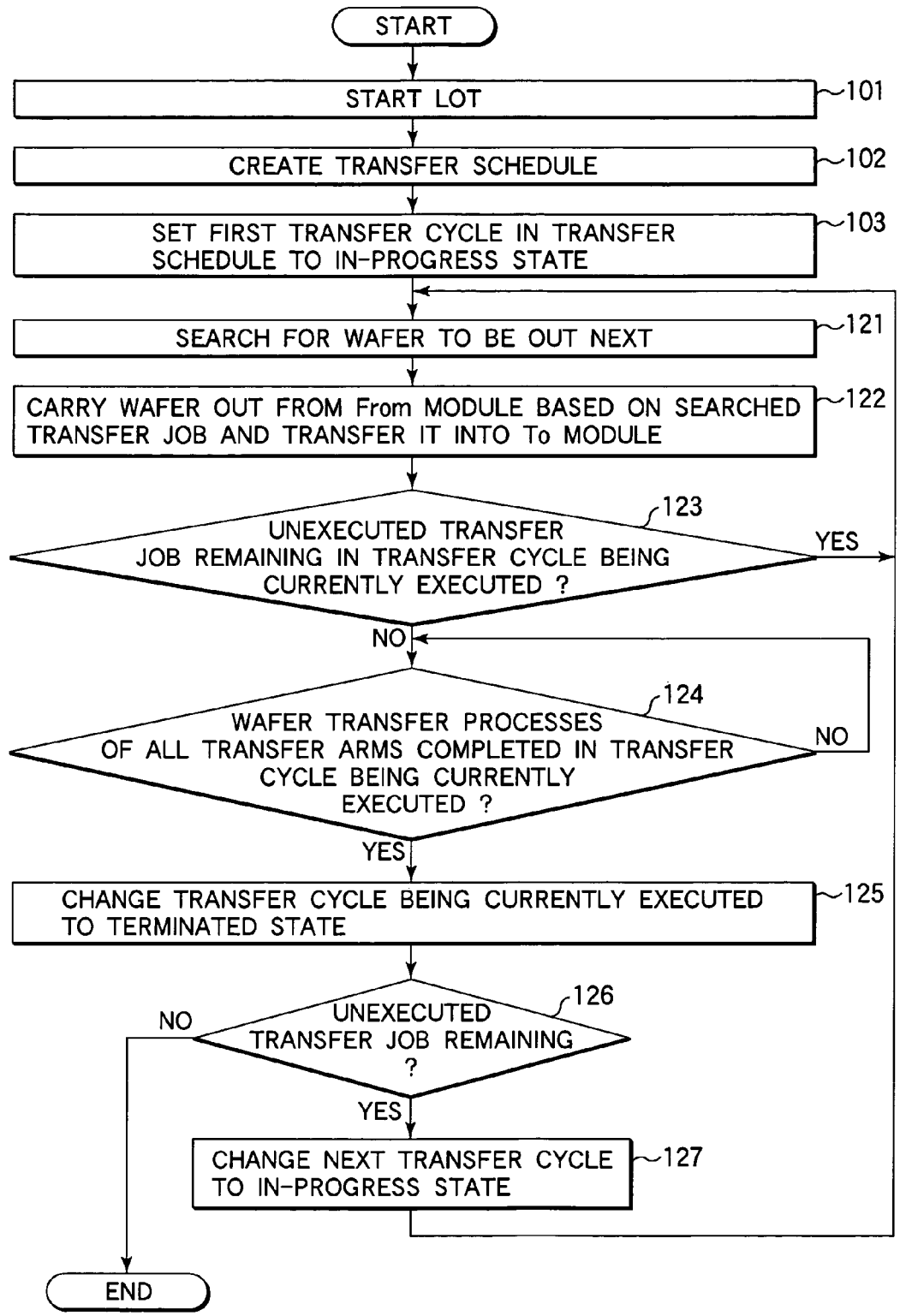
FIG. 7 is a flowchart illustrating a control flow of a transfer operation of a wafer transfer mechanism 24 in the resist coating and developing system in FIG. 1.
Figure 8:
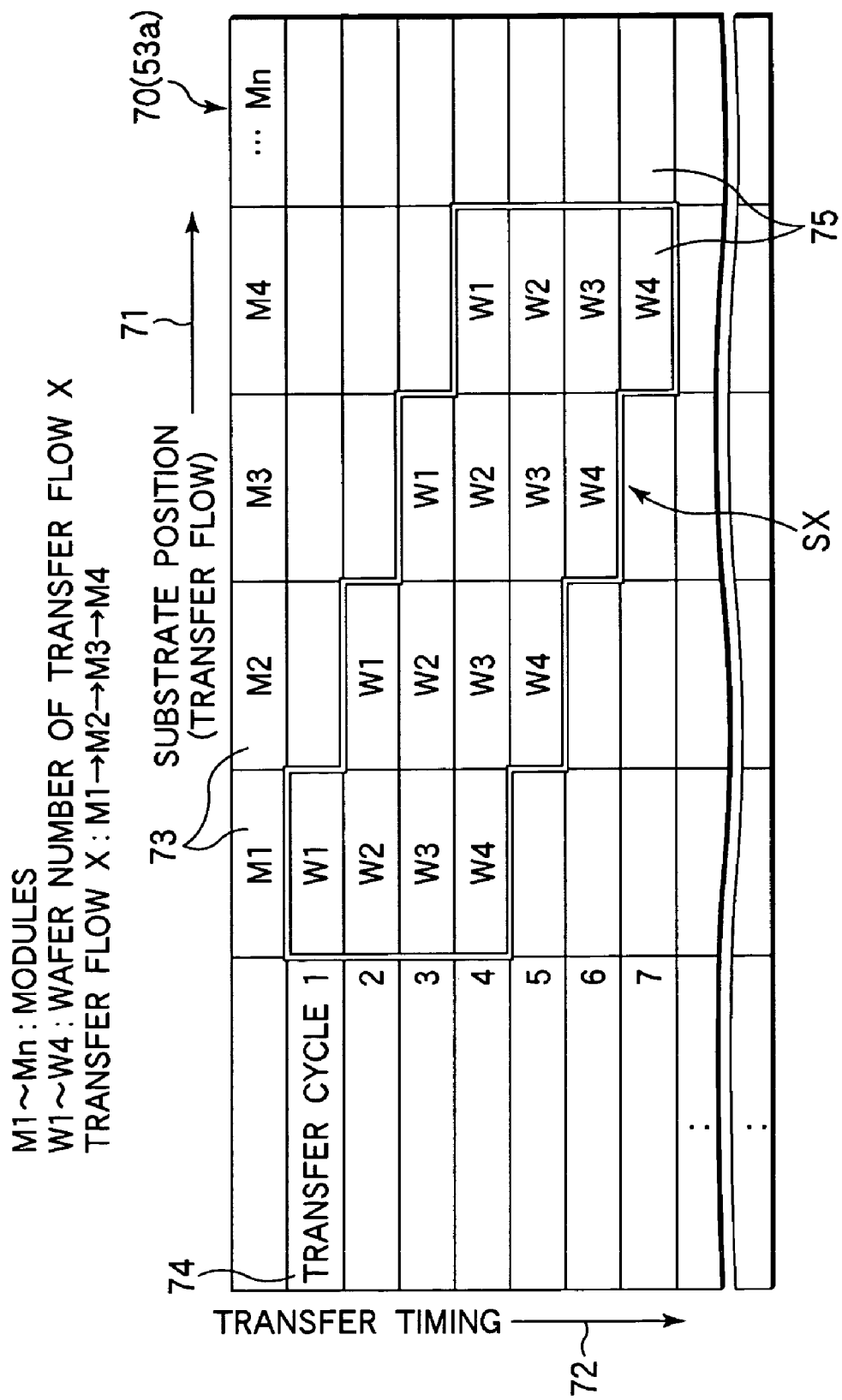
FIG. 8 is a diagram showing one example of a transfer control table to be used in the controls in FIGS. 6 and 7.

Referring to FIGS. 6 to 8, a description will be given of one example of the control operations of the main wafer transfer mechanism 22 and the wafer transfer mechanism 24 in the transfer operation of a wafer W in a sequence of processes. FIG. 6 is a flowchart illustrating the control flow of the transfer operation of the main wafer transfer mechanism 22, FIG. 7 is a flowchart illustrating the control flow of the transfer operation of the wafer transfer mechanism 24, and FIG. 8 is a diagram showing one example of the transfer control table to be used in the controls in FIGS. 6 and 7. In the following description, the module from which a wafer W is carried out by the transfer mechanism in the wafer transfer among modules is described as "From module" and the module to which a wafer W held by the transfer mechanism is transferred is described as "To module". As the wafer transfer mechanism 21 has a simple operation of carrying out a wafer W from the cassette CR and retaining a wafer W there after the process is completed, its description will be omitted.

To begin with, as exemplified in the flowchart in FIG. 6, when a lot starts (transfer flow X (transfer recipe)) (step 101), the controller 50 expands and generates, on the transfer control table 70, a transfer schedule SX which manages information on whether or not each wafer W should be transferred to which module at which transfer cycle timing based on the transfer recipe of that lot and the number of wafers W in the lot previously designated as exemplified in FIG. 8 (step 102). That is, pre-processes of the exposure apparatus up to CR, EXT, AD, COL, COT, HP, EXTCOL, EIS, WEE and EIS and individual processes after exposure up to EXT, HP, DEV, OL, EXT and CR (buffers by which the wafers merely pass are treated as modules in the embodiment) are laid out (set) at M1, M2, ... of the transfer flow axis 71 in the above-described example, the transfer cycle 74 is expanded along the transfer timing axis 72, and the transfer schedule SX comprised of cells (areas of figures surrounded by the double line in FIG. 8) designating modules where individual wafers W in the lot should be positioned in each transfer cycle are expanded and generated at the individual wafer identification information 75 (cells) in the two-dimensional space.

At this time, the pattern (cells) of the transfer schedule is generated in such a way that after the last wafer W in the previous lot is processed, processing of the first wafer W in the next lot starts, and the start timings of the individual lots are optimized as will be discussed later.

The transfer schedule SX automatically created in the above-described manner can be displayed in a visible form on the display 53a of the operation panel 53 as needed, so that the system manager can visually grasp the transfer states of the wafers of the entire lots, and edit the transfer schedule using the keyboard 53b or the like.

Then, the transfer operation is started setting the in-progress state of the first transfer cycle 74 created in the above-described manner (the in-progress flags of the main wafer transfer mechanism 22 and the wafer transfer mechanism 24 are both ON) (step 103).

Then, in the control of the main wafer transfer mechanism 22 exemplified in the flowchart in FIG. 6, a wafer W to be carried out next from each module in the transfer order is searched in the current transfer cycle (row direction) of the transfer control table 70 (step 104). Specifically, of the wafer identification information 75 belonging to the current transfer cycle, the From module (the process has been completed in the previous transfer cycle and wafer carrying out is possible) whose transfer end flag 75b is ON is searched along the transfer flow axis 71, and a wafer W is carried out from the From module based on the search result, and the transfer end flag 75b of the wafer-carried-out module is set OFF (step 105).

Then, it is checked if another wafer W is present in the To module where the wafer W is to be transferred (it is checked if the transfer end flag 75b in the wafer identification information 75 of the To module is ON), and when there is a wafer in the To module (ON), an operation of exchanging the wafer held by the main wafer transfer mechanism 22 with the wafer in that module is repeated among the modules in the forward wafer transfer direction (step 106 and step 108), whereas when there is no wafer in the To module, a wafer is transferred to the To module (step 107).

Thereafter, it is checked whether there is an unexecuted transfer process in the transfer cycle or not (step 109), and when there is such a process, the processes at step 104 and forward are repeated, whereas when there is no such process, the in-progress flag 74c of the local wafer transfer mechanism is set OFF in the current transfer cycle to wait for the wafer transfer processes of all the wafer transfer mechanisms in the transfer cycle to be completed (for all the in-progress flags 74c in the transfer cycle 74 to be OFF) (step 110). Thereafter, the transfer cycle currently being executed is set to the terminated state (step 111), it is checked if there is an unexecuted transfer cycle (step 112), and when there is an unexecuted transfer cycle, the next transfer cycle is changed to an in-progress state (step 113), and the processes at step 104 and forward are repeated. When there is no unexecuted transfer cycle in the step 112, the transfer control is terminated.

Although steps 101 to 103 are common in the wafer transfer mechanism 24 which transfers a wafer with the unillustrated exposure apparatus as exemplified in the flowchart in FIG. 7, the wafer flow is a unidirectional transfer operation from WEE to carrying out, so that wafer exchange does not take place, and steps 106 to 108 in FIG. 6 are omitted from the operation.

That is, a wafer W to be carried out next from each module in the transfer order is searched in the current transfer cycle (row direction) of the transfer control table 70 (step 121), and a wafer W is carried out from the From module based on the search result, and the transfer end flag 75b of the wafer-carried-out module is set OFF and a wafer is transferred to the To module (step 122).

Thereafter, it is checked if there is an unexecuted transfer JOB in the transfer cycle (step 123), and when there is such a JOB, the processes at and following step 121 are repeated, whereas when there is no such JOB, the in-progress flag 74c of the local wafer transfer mechanism is set OFF in the current transfer cycle to wait for the wafer transfer processes of all the wafer transfer mechanisms in the transfer cycle to be completed (for all the in-progress flags 74c in the transfer cycle 74 to be OFF) (step 124). Thereafter, the transfer cycle currently being executed is set to the terminated state (step 125), it is checked if there is an unexecuted transfer cycle (step 126), and when there is an unexecuted transfer cycle, the next transfer cycle is changed to an in-progress state (step 127), and the processes at step 121 and forward are repeated. When there is no unexecuted transfer cycle in the step 126, the transfer control is terminated.

Even in a complex transfer recipe (transfer flow) using a plurality of modules, the transfer timing of an individual wafer W can be fixed for every wafer in the lot at the time of starting the lot by setting the transfer schedule on the transfer control table 70 and reading the set result for each transfer cycle along the time axis direction to control the transfer operation. This makes it possible to achieve a stable wafer transfer process in the resist coating and developing system without a problem, such as disturbance of the transfer time.

Even after the transfer process has started, the feedforward control to adequately change the transfer schedule already set on the transfer control table 70 is possible before the transfer cycle starts, making it possible to set various transfer schedules and change the transfer schedule.

As each wafer transfer mechanism operates in a give period in the transfer cycle, a variation in the process history originating from movement in a sequence of modules does not occur, and uniform processing can be performed on all the wafers W in the lot.

Figures 9A, 9B, 9C:
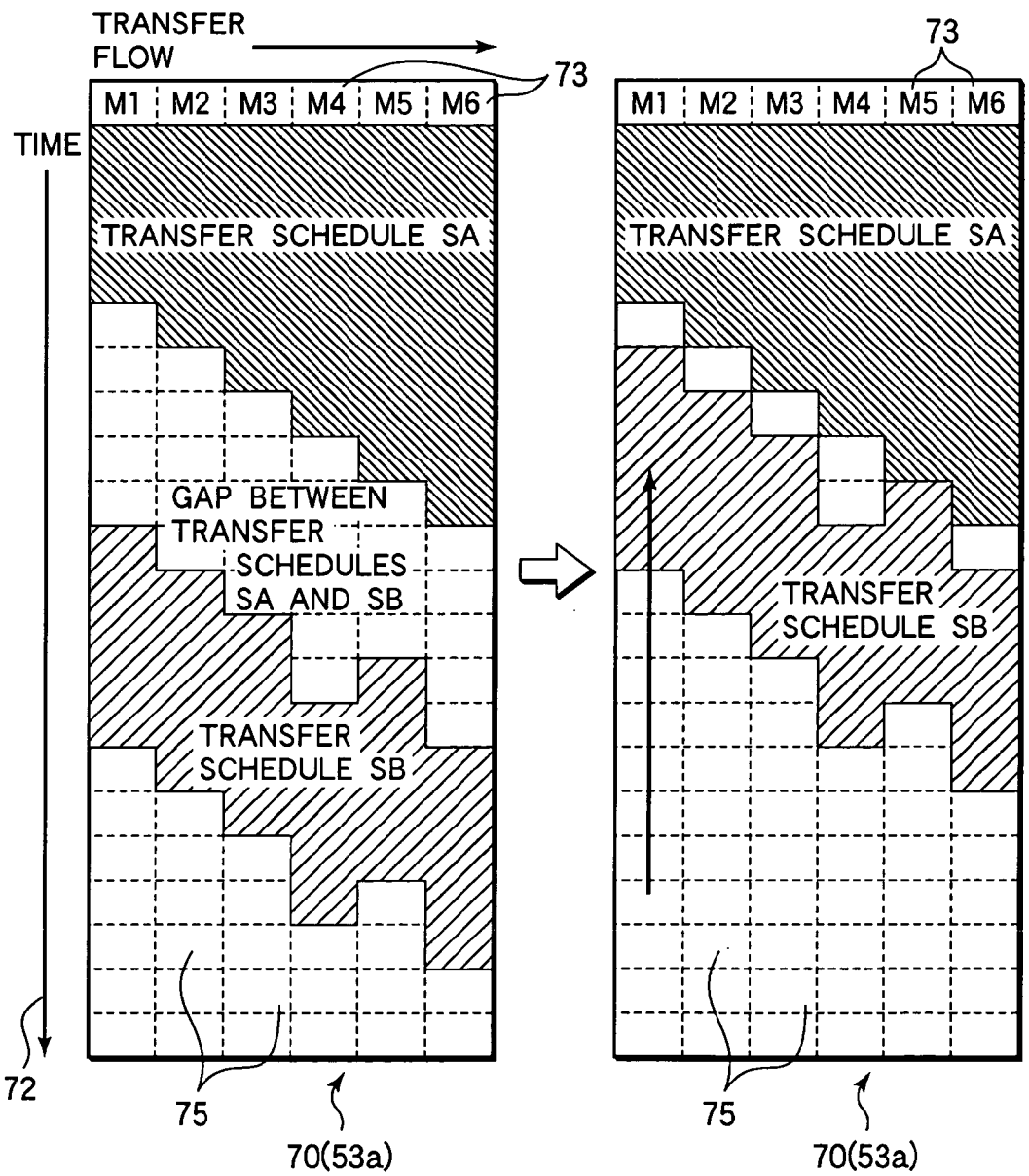
FIG. 9A is a diagram illustrating a transfer flow according to an embodiment which is adapted to a case where a plurality of different lots are processed consecutively.
FIGS. 9B and 9C are conceptual diagrams illustrating transfer schedules for carrying out the transfer flow in FIG. 9A.
Figure 10:
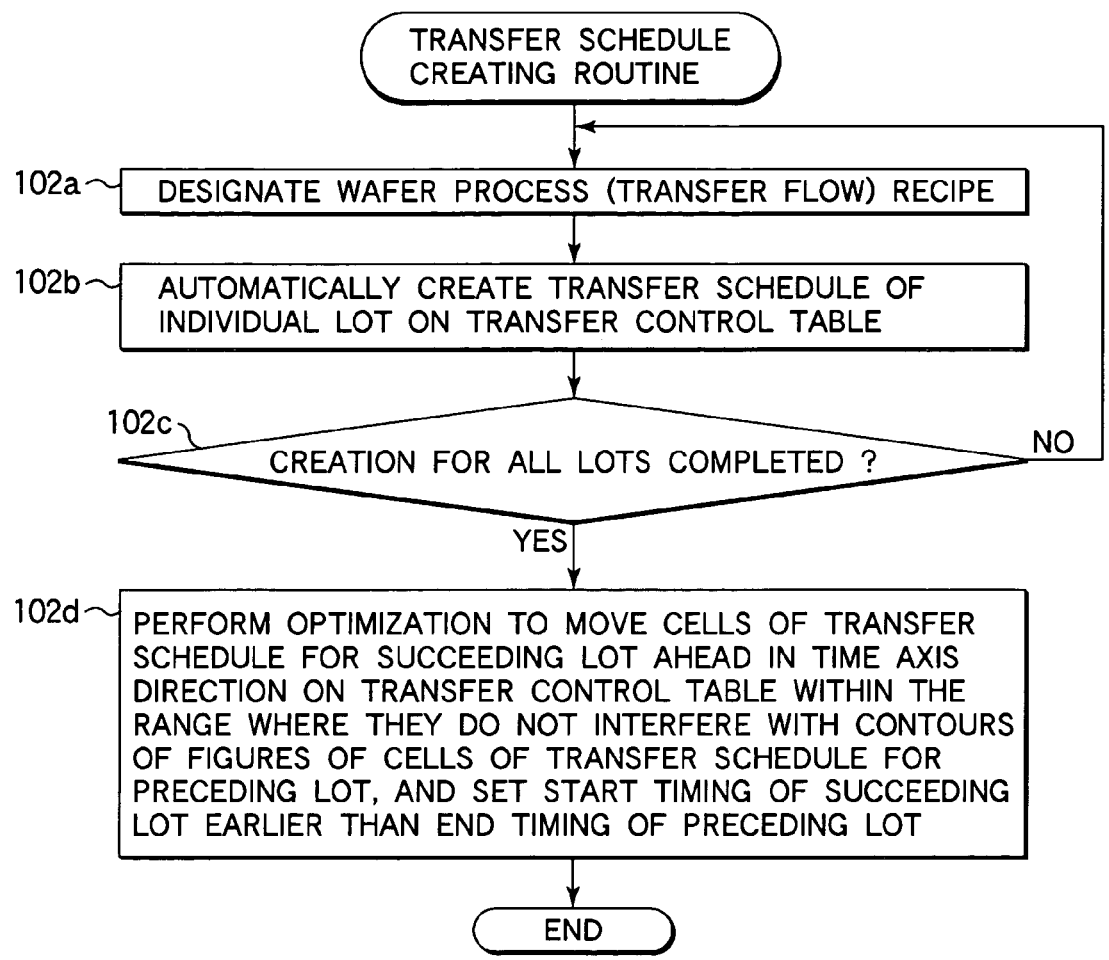
FIG. 10 is a flowchart for achieving the transfer schedules in FIGS. 9B and 9C.

While the above is the processing of a single lot, when a plurality of lots (an A lot with a transfer flow A and a B lot with a transfer flow B) are consecutively processed, as shown in FIG. 9A, one example of the process of creating the transfer schedule at step 102 becomes as shown in FIG. 10. That is, first, a recipe of a wafer process (transfer recipe) is designated (step 102a), and a process of automatically generating the transfer schedule of that lot on the transfer control table 70 (step 102b) is repeated for all the lots (step 102c). That is, creation of the transfer schedule on the transfer control table 70 described referring to FIG. 8 is consecutively carried out for the transfer flow A and the transfer flow B. At this time, as shown in FIG. 9B, the pattern of the transfer schedule is generated in such a way that after the last wafer W in the previous lot is processed, processing of the first wafer W in the next lot starts.

As shown in FIG. 9C, all the cells of the transfer schedule SB in the transfer control table 70 are moved in such a way that the succeeding transfer schedule SB is set closer to the generated transfer schedule SA of the preceding lot in the time axis direction within the range where the transfer schedule SB (the contours of figures constituted by the cells of the wafer identification information 75) do not interfere with the transfer schedule SA (the contours of figures constituted by the cells of the wafer identification information 75) (step 102d). This quickens the start timing for the succeeding transfer schedule SB, so that the overall process time becomes shorter than the simple summation of the individual process times at which the process of the B lot starts after the process of the A lot ends.

This is exemplified more specifically in FIGS. 11A to 11C. As shown in FIG. 11A, in the transfer control table 70 in a case where the A lot comprising a plurality of wafers W A1 to A5 (transfer flow A: continuous processes of modules M1 to M8) and the B lot comprising a plurality of wafers W B1 to B5 (transfer flow B: processes of modules M1 to M4, M7 and M8) are continuously processed, when the A lot and the B lot are processed serially, the total process time becomes the sum of the process times of the A lot and the B lot as shown in FIG. 11B.

According to the embodiment, by way of contrast, because the transfer schedule SB of the B lot is moved within a range where it does not interfere with the transfer schedule SA of the A lot preceding in the time axis direction, the transfer process of the wafer B1 in the B lot is started in parallel to the A lot preceding in the same transfer cycle from the transfer cycle 7 previous to the transfer cycle 11 in which the A lot is finished, as exemplified in FIG. 11C. According to the embodiment, as apparent from the above, the start timing for the succeeding B lot is quickened without causing a problem, such as occurrence of passing a wafer W between lots, so that the total process time of the A lot and the B lot becomes significantly shorter, thus improving the throughput.

In the example in FIGS. 11A to 11C, given that one transfer cycle is 50 seconds, as one example, the total process time=21×50 seconds=1050 seconds in the conventional case in FIG. 11B, whereas the total process time=16×50 seconds=800 seconds in the embodiment case in FIG. 11C, and can be shorted by about 25%.

When a plurality of lots with the same transfer flows A and B are processed consecutively, as shown in FIG. 12A, the transfer start timing for the modules which are common to the preceding and succeeding A lot and B lot can be set ahead to prevent occurrence of a gap between transfer cycles, thereby improving the activity rate of the individual modules, as exemplified in FIG. 12B.

It is to be noted however that in a transfer process in which an external module (EIS), such as an exposure apparatus, and a preceding buffer (BUF) pass a wafer as in the same diagram, there may be an undesirable case where the time passed from a pre-exposure process, such as resist coating, to an exposure process in the exposure apparatus varies between wafers in the succeeding B lot due to the influence of the preceding wafer remaining in the buffer. In this case, as exemplified in FIG. 12C, the transfer start timing is set ahead (ahead from the transfer cycle 16 to the transfer cycle 9 in this case) within the range where the preceding A lot is not interfered with while maintaining the positional relationship (the contours of figures of the cells) of the layout state of the wafer identification information 75 (cells) in the time axis direction in the transfer schedule SB for the B lot. This can prevent the transfer time between wafers in the succeeding lot from varying due to the influence of the transfer state of the preceding lot while shortening the overall process time of plural lots.

Figures 13A, 13B:
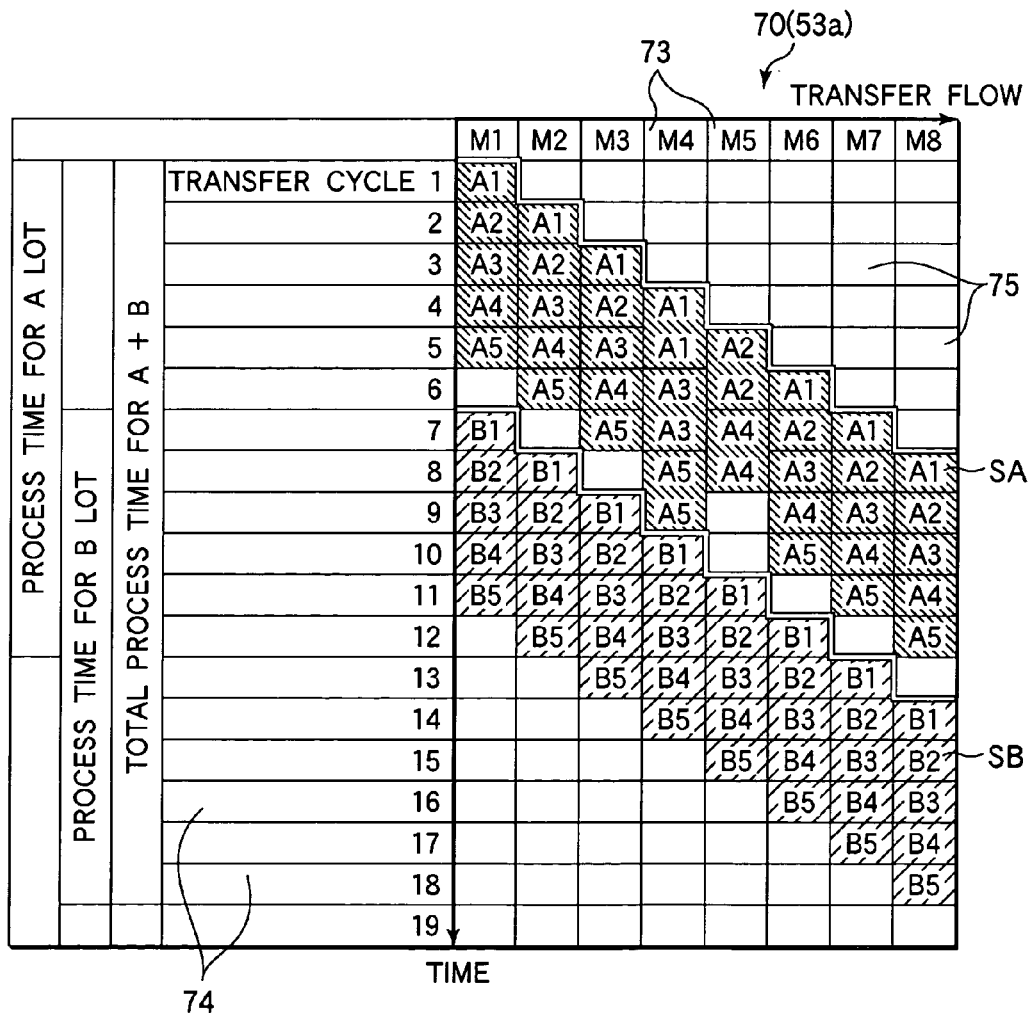
FIG. 13A is a diagram illustrating a transfer flow embodying the transfer flow in FIG. 9A.
FIG. 13B is a diagram showing a further different example of a transfer table originating from the conceptual diagrams in FIGS. 9B and 9C based on the transfer flow in FIG. 13A.

FIG. 13B illustrates an example where the embodiment is adapted to an example of the transfer flow shown in FIG. 13A in which the modules to be used have the same type but are used differently between the preceding A lot and the succeeding B lot. That is, while both are common in using the modules M1 to M8, plural modules M4 and M5 having the same function are used in the recipe including a specific process in which the required time is longer than the cycle time, and a multi-flow of distributing wafers to the M4 and M5 and processing the specific process in parallel is carried out in the transfer flow A, whereas a single flow of separating the specific process in which the required time is longer than the cycle time to preceding and succeeding two modules M4 and M5 having the same function is carried out in the transfer flow B. Even in the flow in FIG. 13A, an improvement on the throughput can be expected by setting the transfer start timing for the succeeding B lot ahead (ahead from the transfer cycle 13 to the transfer cycle 7 in this case) as shown in FIG. 13B.

The present invention is not limited to the embodiment, and can be modified in various forms. For example, the substrate is not limited to a semiconductor wafer, but can be widely adapted to a transfer process of ordinary substrates, such as a photomask substrate and a liquid crystal display substrate.

INDUSTRIAL APPLICABILITY

As discussed above, the present invention can achieve a stable substrate transfer process by suppressing the disturbance of the transfer time at the time of executing multifarious transfer recipes.

It is possible to achieve an improvement of the throughput by shortening the process time in consecutive process of a plurality of lots with multifarious transfer recipes.

It is also possible to achieve multifarious transfer controls by feedforward control in a substrate transfer process.

It is further possible to improve the operability in the substrate transfer control.

The invention claimed is:

1. A substrate processing system comprising:
   a plurality of modules whereupon a substrate is transferred into and out of said modules;
   a substrate transfer mechanism which transfers the substrate between said modules; and
   a control section which controls the substrate transfer mechanism to transfer a first lot of substrates and a second lot of substrates with a first transfer flow and a second transfer flow, respectively, said first transfer flow and said second transfer flow are different from each other relative to said modules, said first lot of substrates being processed before said second lot of substrates,
   wherein the control section includes:
   a first function of forming a transfer control table formed of a two-dimensional table defined by a transfer flow axis denoting said modules as a row and a time axis denoting transfer timings of the substrate relative to said modules, said first function is preset to regard, as cells, intersection points each specified by one of said transfer timings and one of said modules on said transfer control table, and to correlate the cells with substrate identification information to generate a first transfer schedule of said first lot of substrates and a second transfer schedule of said second lot of substrates, a second function of modifying said second control transfer schedule by use of said transfer control table, said second function is preset to recognize a first cell group of cells defining said first transfer schedule as a first figure and a second cell group of cells defining said second transfer schedule as a second figure on said transfer control table, and to shift said second figure toward said first figure along the time axis to modify said second transfer schedule within a range in which said second figure does not interfere with said first figure, and a third function of controlling said substrate transfer mechanism to transfer said first lot of substrates and said second lot of substrates in accordance with said first transfer schedule and said second transfer schedule.

2. The substrate processing system according to claim 1, wherein said second function is preset to shift said second figure toward said first figure along the time axis until a front side of said second figure comes into contact with said first figure.

3. The substrate processing system according to claim 1, wherein said modules include process modules.

4. The substrate processing system according to claim 3, wherein said process modules are configured to perform resist coating, development after resist exposure, hydrophobic processing of semiconductor substrates, heating and cooling.

* * * * *